United States Patent
Hanson et al.

(10) Patent No.: US 9,939,826 B2
(45) Date of Patent: Apr. 10, 2018

(54) LOW POWER TUNABLE REFERENCE CURRENT GENERATOR

(75) Inventors: Scott Hanson, Austin, TX (US); Kenneth Gozie Ifesinachukwu, Austin, TX (US); Ajaykumar A. Kanji, Austin, TX (US)

(73) Assignee: Ambiq Micro, Inc., Austin, TX (US)

( * ) Notice: Subject to any disclaimer, the term of this patent is extended or adjusted under 35 U.S.C. 154(b) by 971 days.

(21) Appl. No.: 14/342,177

(22) PCT Filed: Jun. 29, 2012

(86) PCT No.: PCT/US2012/045077
§ 371 (c)(1),
(2), (4) Date: Feb. 28, 2014

(87) PCT Pub. No.: WO2013/006482
PCT Pub. Date: Jan. 10, 2013

(65) Prior Publication Data
US 2014/0218071 A1  Aug. 7, 2014

Related U.S. Application Data

(60) Provisional application No. 61/504,223, filed on Jul. 3, 2011.

(51) Int. Cl.
| | |
|---|---|
| G05F 1/46 | (2006.01) |
| G06F 1/08 | (2006.01) |
| G06F 1/10 | (2006.01) |
| H03K 21/02 | (2006.01) |
| H03K 23/50 | (2006.01) |
| H03K 3/012 | (2006.01) |
| G05F 3/08 | (2006.01) |

(52) U.S. Cl.
CPC ............... G05F 1/462 (2013.01); G05F 3/08 (2013.01); G06F 1/08 (2013.01); G06F 1/10 (2013.01); H03K 3/012 (2013.01); H03K 21/023 (2013.01); H03K 23/50 (2013.01)

(58) Field of Classification Search
CPC ...................................... G05F 1/561
See application file for complete search history.

(56) References Cited

U.S. PATENT DOCUMENTS

| | | | | |
|---|---|---|---|---|
| 8,564,275 B2* | 10/2013 | Seok | ........................ | G05F 3/242 |
| | | | | 323/313 |
| 8,841,938 B2* | 9/2014 | Wu | ........................ | H02M 11/00 |
| | | | | 327/103 |
| 9,147,443 B2* | 9/2015 | Hanson | ................... | G11C 5/147 |
| 9,608,586 B2* | 3/2017 | Du | ........................ | H03F 1/0233 |

* cited by examiner

*Primary Examiner* — Hai L Nguyen
(74) *Attorney, Agent, or Firm* — Hunt Pennington Kumar & Dula, PLLC; Artie Pennington; Jeffrey Van Myers

(57) ABSTRACT

An improved reference current generator for use in an integrated circuit. A voltage difference generator generates two voltages that are separated by a relatively small electrical potential. The two closely separated voltages are applied across a resistive element with relatively large impedance value resulting in a small and stable reference current. The stable reference current is mirrored and, if desired, amplified for use on the integrated circuit. A driver selectively drives state information off chip for assisting in post-silicon correction of unwanted sensitivities. A configuration memory stores values used to adjust effective device widths and lengths for correcting unwanted sensitivities.

13 Claims, 6 Drawing Sheets

LOW POWER TUNABLE REFERENCE CURRENT GENERATOR

CROSS-REFERENCE TO RELATED APPLICATIONS

This application claims priority to U.S. Provisional Application Ser. No. 61/504,223 filed 3 Jul. 2011 ("Parent Provisional"), and hereby claims benefit of the filing dates thereof pursuant to 37 CFR § 1.78(a)(4). The subject matter of the Parent Provisional, in its entirety, is expressly incorporated herein by reference.

This application is also related to the pending U.S. application Ser. No. 12/823,160, filed on 25 Jun. 2010 by the Regents of the University of Michigan, and to the pending U.S. application Ser. No. 13/472,870, filed on 16 May 2012 by the Regents of the University of Michigan (collectively, "Related Applications"). The subject matter of the Related Applications, in their entirety, is expressly incorporated herein by reference.

This application is related to application Ser. No. 14/342,189, filed simultaneously herewith ("Related Co-application"). The subject matter of the Related Co-application, in its entirety, is expressly incorporated herein by reference.

FIELD OF THE INVENTION

The present invention relates generally to reference current circuits used in integrated circuits, and, in particular, to low power reference current circuits.

BACKGROUND OF THE INVENTION

In general, in the descriptions that follow, we will italicize the first occurrence of each special term of art that should be familiar to those of ordinary skill in the art of low power current reference design. In addition, when we first introduce a term that we believe to be new or that we will use in a context that we believe to be new, we will bold the term and provide the definition that we intend to apply to that term. In addition, throughout this description, we will sometimes use the terms assert and negate when referring to the rendering of a signal, signal flag, status bit, or similar apparatus into its logically true or logically false state, respectively, and the term toggle to indicate the logical inversion of a signal from one logical state to the other. Alternatively, we may refer to the mutually exclusive boolean states as logic_0 and logic_1. Of course, as is well known, consistent system operation can be obtained by reversing the logic sense of all such signals, such that signals described herein as logically true become logically false and vice versa. Furthermore, it is of no relevance in such systems which specific voltage levels are selected to represent each of the logic states.

Power consumption has become a key problem for circuit designers with the proliferation of battery-powered devices. Circuit topologies that support power reduction are extremely valuable in extending battery life. Reference current generators are present in virtually any integrated circuit ("IC") since all analog electronics require a bias current for proper operation. This reference current is also generally temperature-compensated such that the current is substantially insensitive to temperature or proportional to absolute temperature ("PTAT") or complementary to absolute temperature ("CTAT"). Most reference current generators draw significant power due to the heavy use of saturated transistors and relatively small resistors.

Reference currents can be generated in a wide variety of ways. Several prior art examples are shown in FIG. 1 and FIG. 2. In one such prior art example of a reference current generator circuit 10, shown in FIG. 1, an amplifier 12 develops a reference current, $I_{Ref}$, proportional to a reference voltage, $V_{Ref}$, developed by a reference voltage generator (e.g., a bandgap reference voltage generator) 14 across a resistor 16. Reference voltage generator 14 and resistor 16 are both reasonably temperature insensitive, and can be tuned to achieve a desired temperature sensitivity (e.g., zero temperature sensitivity, PTAT, CTAT). However, reference current generator circuit 10 consumes considerable power, and, in particular, reference voltage generator 14 draws significant power, nominally on the order of one microamp (1 μA). Further, the combination of a large reference current, $I_{Ref}$, combined with a relatively small resistor 16 results in additional power dissipation. Assuming, e.g., a typical bandgap reference voltage of 1.25V and a typical on-chip resistor 16 of 100 kΩ, reference current generator circuit 10 consumes a reference current of 1.25/100e3=12.5 μA. This current is well in excess of limits imposed by many modern battery-powered devices.

Shown in FIG. 2 is an alternative circuit 18 that can achieve good temperature sensitivity. However, the active devices in reference current generator circuit 18 are operated in the saturation region, and thus will typically draw much more than 1 μA of current.

FIG. 3 illustrates a reference current generator 20 we first disclosed to the University of Michigan, and which is now the subject matter of the Related Applications. This reference current generator 20 is capable of creating a carefully controlled current reference in an energy efficient manner, as disclosed in the Related Application. The generated current reference can be substantially insensitive to temperature, PTAT, or CTAT. Generally speaking, the reference current generator 20 operates by generating a pair of voltages, illustrated in FIG. 3 as $V_{TOP}$ and $V_{BOT}$. This pair of voltages may be each buffered and amplified. An exemplary buffering circuit is illustrated in FIG. 3; $V_{TOP}$ is buffered and amplified by a two stage buffer comprising a first stage amplifier circuit 22 and a second stage N-channel transistor 24, resulting in the substantially constant voltage at the source of the N-channel transistor 24, illustrated as $V_{TOPBUF}$. A similar configuration of first stage amplifier 26 and P-channel transistor 28 operates to buffer $V_{BOT}$ in an analogous manner. The resulting pair of buffered and amplified voltages may then be applied across resistive element 30. FIG. 3 also illustrates the current generating half of a typical current mirror comprising a diode-connected P-channel transistor as the source of the desired reference current, illustrated as $I_{REF}$ in the figure. Detailed disclosure of these circuits is contained and illustrated in the Related Applications and should be readily apparent to one of ordinary skill in this art. FIG. 4 illustrates an example where P-channel transistors may readily be used in lieu of N-channel transistors for the voltage ladder. FIG. 4 also illustrates the current generating half of a typical current mirror as N-channel transistor 32', illustrating that an N-channel current mirror may readily be used in lieu of its P-channel transistor equivalent. These circuit configurations will be readily apparent to one of ordinary skill in this art. The specific implementation disclosed in the Related Applications is of high value due to its energy efficient qualities. However, this implementation lacks several elements that are critical to mass production of IC devices that utilize the specific implementation. In particular, the desired elements lacking are: (1) a mechanism for measuring the internal state, e.g., voltages and currents, after manufacture; (2) an adjustment mechanism for managing post-silicon variations due to process, voltage, and temperature variations in the manufacturing process; and (3) a mechanism for generating multiple currents and/or voltages for use elsewhere in the IC device.

Given the wide use of current reference generators and the significant power demands of these circuits, we submit that what is needed is an improved method and apparatus for an ultra-low power temperature compensated reference current generator that addresses the lack of the aforementioned elements. Such a method and apparatus are important for use in power sensitive systems such as battery-powered electronics.

BRIEF SUMMARY OF THE INVENTION

In accordance with a preferred embodiment of our invention, we provide a circuit for developing a reference current. This circuit comprises a voltage difference generator, a resistive element, a current mirror and a configuration memory. The voltage difference generator develops a first voltage and a second voltage. The voltage difference generator also develops a first state voltage as a function of the first and second voltages and a first control signal. The resistive element receives the first and second voltages, and develops a first reference current that is a function of the first and second voltages. The resistive element also develops a first state current as a function of the first and second voltages and a second control signal. The current mirror receives the first reference current and develops an output current as a function of the first reference current. The current mirror also develops a second state current as a function of said first reference current and a third control signal. The configuration memory develops a selected one of the first control signal, the second control signal, and the third control signal.

We submit that each of these embodiments of our invention provide for an ultra-low power temperature compensated reference current generator, the performance being generally comparable to the best prior art techniques while requiring less circuitry and consuming less power than known implementation of such prior art techniques.

BRIEF DESCRIPTION OF THE SEVERAL VIEWS OF THE DRAWINGS

Our invention may be more fully understood by a description of certain preferred embodiments in conjunction with the attached drawings in which.

Figure 1:
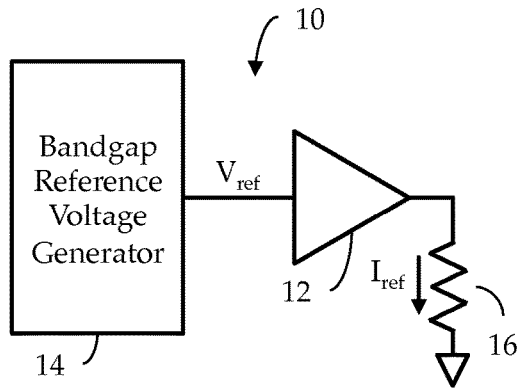
FIG. 1 illustrates, in block diagram form, an embodiment of a prior art reference current generator circuit.
Figure 2:
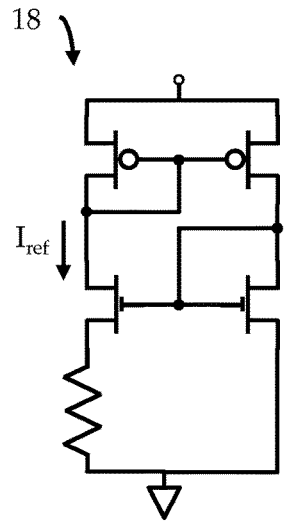
FIG. 2 illustrates, in block diagram form, another embodiment of a prior art reference current generator circuit.

In the drawings, similar elements will be similarly numbered whenever possible. However, this practice is simply for convenience of reference and to avoid unnecessary proliferation of numbers, and is not intended to imply or suggest that our invention requires identity in either function or structure in the several embodiments.

DETAILED DESCRIPTION OF THE INVENTION

Figure 3:
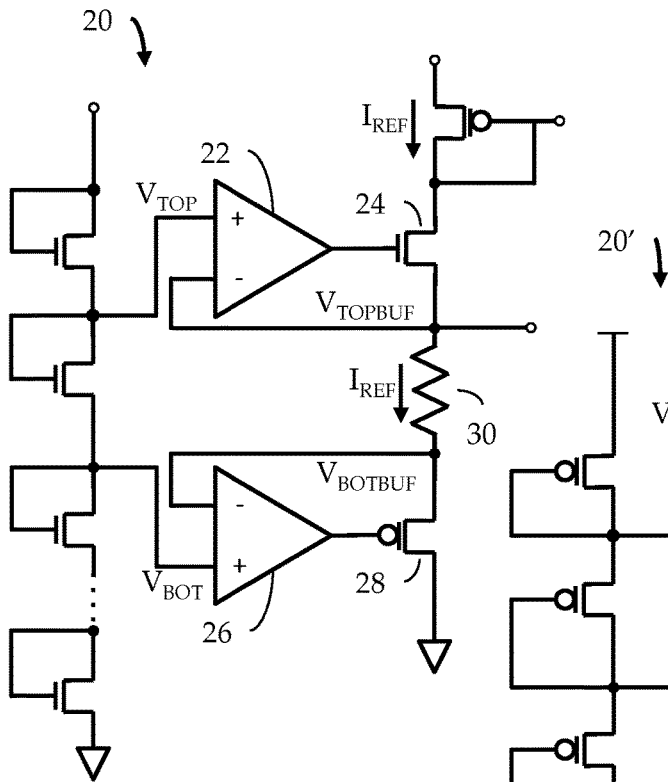
FIG. 3 illustrates, in block diagram form, another embodiment of a prior art reference current generator circuit.
Figure 4:
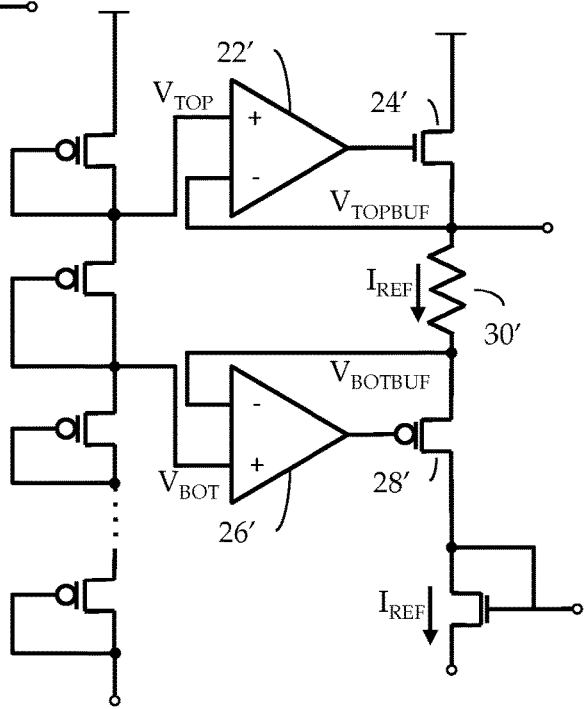
FIG. 4 illustrates, in block diagram form, another embodiment of a prior art reference current generator circuit.
Figure 5:
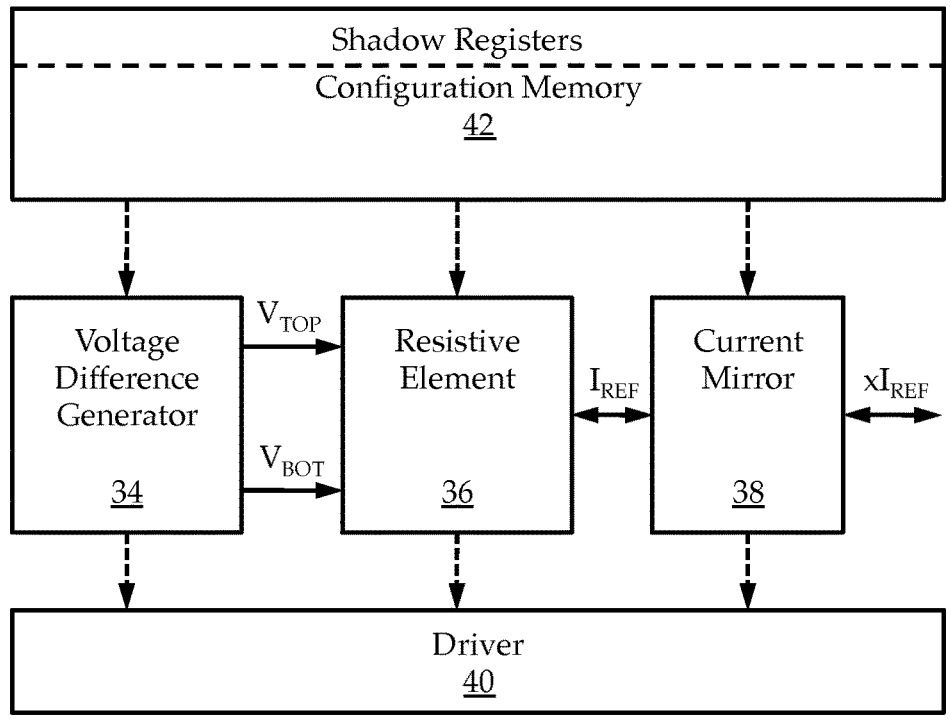
FIG. 5 illustrates, in block diagram form, an embodiment of a tunable reference current generator circuit according to our invention.

Illustrated in FIG. 5 is a new reference current generator 32 in accordance with a preferred embodiment of our invention. This new reference current generator 32 draws significantly less power (e.g., on the order of 10-1000 times less) than existing current reference generators while still achieving outstanding temperature and process compensation. As noted above, at least one of the prior art approaches is able to achieve excellent temperature sensitivity. However this achievement comes at the expense of dissipating power in excess of the low power needs of ultra-low power ICs with current budgets on the order of nanoamps. Our new reference current generator 32 topology achieves minimum power while still maintaining excellent temperature sensitivity. Similar to our prior art reference current generator illustrated in FIG. 3, our new reference current generator 32 comprises: a voltage difference generator 34 adapted to develop two difference voltages, $V_{TOP}$ and $V_{BOT}$, that are relatively close in value; a resistive element 36 having a relatively high impedance value (e.g., greater than 1MΩ); and a current mirror 38 adapted to develop the reference current, $I_{REF}$, as a function of the difference voltages and the resistive value of resistive element 36. The application of a relatively small voltage difference across a resistive element of a relatively large value results in the development of the desired reference current, $I_{REF}$, significantly more efficiently. It should be noted that we have depicted $I_{REF}$ using a bidirectional arrow to indicate that, as we will explain further below, our current mirror 38 may be implemented as either a current source or a current sink, or, if desired, both. We have also indicated, again using a bidirectional arrow, that our current mirror 38 may be adapted, as explained in detail below, to develop an output reference current, $xI_{REF}$, according to a desired mirror function of $I_{REF}$.

As indicated in FIG. 5, our new reference current generator 32 includes a driver 40 adapted: to receive status signals indicating the internal state of the voltage difference generator 34, the resistive element 36, and the current mirror 38; and to drive at least one of these status signals off-chip. This increased observability into the internal states of the various circuit blocks and components allows the effects of temperature fluctuations, voltage fluctuations and process-related variations to be estimated during testing of the IC. This state information may be subsequently used to establish control values selectively written into a configuration memory 42. The values written into the configuration memory 42 may be used as part of the overall post-silicon compensation and adjustment scheme of the new reference current generator 32. This post-silicon compensation scheme is important for energy efficient circuits that use sub-threshold biased transistors. The characteristics of sub-threshold-biased transistors are exponentially sensitive to process, voltage, and temperature fluctuations. As a result, without an effective post-silicon compensation scheme, large variations in the new reference current generator 32 output may occur. The driver 40 typically includes a set of analog multiplexers to select from a set of target currents and voltages. Typically, it will additionally include a means of buffering on-chip voltages and current such as a current mirror, voltage amplifier to reduce noise during off-chip measurement. The driver 40 may also include circuits such as RC oscillators for generating frequencies from which current and/or voltage values may be inferred.

Preferably, configuration memory 42 stores adjustment parameters used to correct undesired sensitivities to process, voltage, and temperature. These parameters are derived from measured values received from the driver 40. Using an external tester, internal state information is acquired via the driver 40, and, based upon the acquired state information, a set of adjustment parameters is determined and subsequently stored in the post-silicon configuration memory 42. Exemplary memories include non-volatile storage elements like NVRAM, flash memory, EEPROM, ROM, one-time programmable memory and other analogous memory structures. Volatile memory such as SRAM and their analogous memory structures may also be used. In accordance with our invention, the several control bits stored in the post-silicon configuration memory 42 may be selectively transmitted to any of the voltage difference generator 34, the resistive element 36 or the current mirror 38 to correct for any unwanted sensitivities to process, voltage, and temperature. Note that this requires that the voltage difference generator 34, the resistive element 36 and the current mirror 38 implement suitable mechanisms for adjustment.

Figure 6:
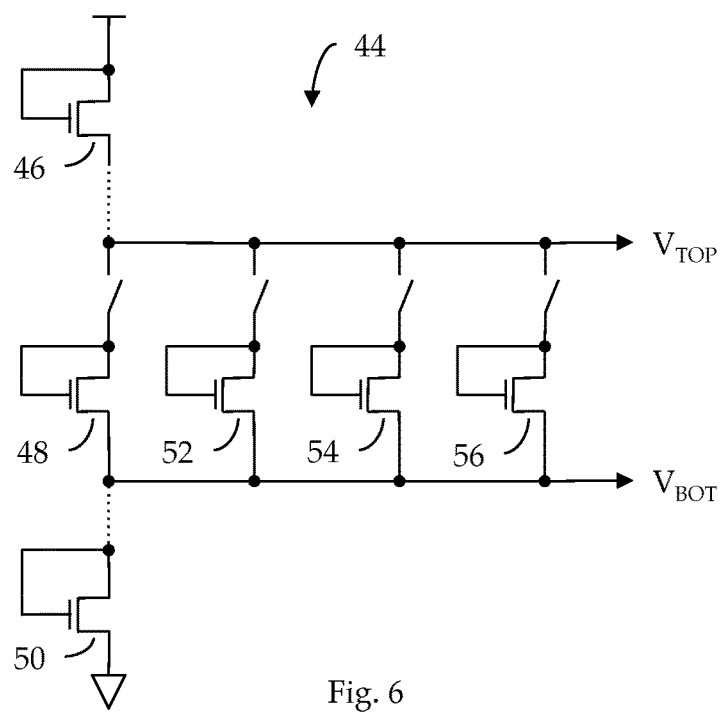
FIG. 6 illustrates, in schematic form, an implementation of a tunable voltage difference generator according to the invention illustrated in FIG. 5.

In accordance with an embodiment of our invention, FIG. 6 illustrates an adjustable voltage difference generator 44 with the requisite mechanisms for adjustment. In general, adjustable voltage difference generator 44 comprises a tunable voltage difference generator implemented as a voltage ladder that generates closely separated voltages $V_{TOP}$ and $V_{BOT}$. Voltage ladders are commonly understood to one skilled in this art, and are typically constructed as a stack of series-connected resistive circuit elements of various types. We prefer to implement our voltage ladder as a series-connected stack of diode-connected sub-threshold biased transistors, i.e., diodes, illustrated in FIG. 6 as N-channel transistors 46, 48, and 50. We have depicted dotted lines between transistors 46-48 and 48-50 to indicate that additional diodes may be placed in the series-connected stack, thus facilitating the adjustment of the selected voltages to the desired voltage potential.

Tuning of the adjustable voltage difference generator 44 may be achieved through the use of a variable number of diodes selectively connected in parallel with one of the diodes in the voltage ladder stack. Variations due to process, voltage, and/or temperature are addressed through this means of selectively connecting additional diodes in parallel with one of the diodes in the stack. In our particular example, these parallel diodes are illustrated as N-channel transistors 52, 54, and 56, each adapted to be selectively connected in parallel to N-channel transistor 48. In accordance with our invention, respective control bits received from configuration memory 42 select the combination of diodes that are connected in parallel. In our example, N-channel transistors 48, 52, 54 and 56 are sequentially sized up by a factor of two, i.e., binary weighted, to allow the effective width of the diode to be adjusted with fine granularity over a wide range. Alternatively, adjustability can be achieved by changing the number of diodes in the series stack instead of the number of diodes in parallel. For this example, we have chosen to place three devices in parallel with N-channel transistor 48 purely for illustrative purposes and contemplate that a smaller or greater number of devices may be used, depending on the granularity of control deemed necessary to correct the unwanted sensitivities. P-channel transistors may readily be used in lieu of N-channel transistors as will be readily apparent to one of ordinary skill in this art.

Figure 7:
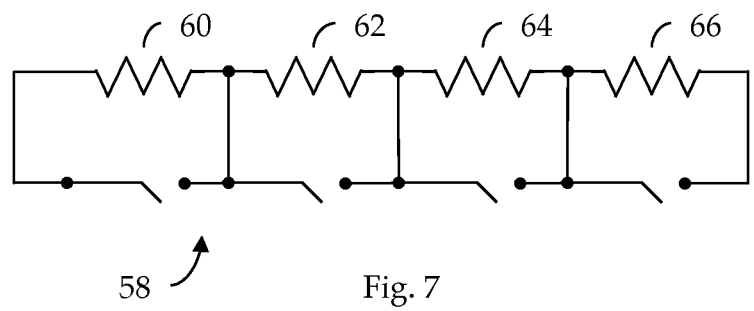
FIG. 7 illustrates, in schematic form, an exemplary tunable resistive element according to the invention illustrated in FIG. 5.

In accordance with an embodiment of our invention, FIG. 7 illustrates an adjustable resistive element 58 with the requisite mechanisms for adjustment. In general, adjustable resistive element 58 comprises a tunable resistive element implemented as a resistive ladder. We prefer to implement our adjustable resistive element 58 as variable number of series-connected resistors, illustrated in FIG. 7 as resistors 60, 62, 64 and 66. Alternatively, circuits such as those disclosed in the Related Applications may also be used in lieu of actual resistors, such as the two-transistor resistor circuit, and will readily apparent to one skilled in this art. Variations due to process, voltage, and/or temperature are addressed though this means of selectively connecting additional resistors in series with each other. Respective control bits received from configuration memory 42 select the combination of resistors connected in series. In this example, resistors 60, 62, 64 and 66 are sequentially sized up by a factor of two, i.e., binary weighted, to allow the effective resistance of the ladder to be adjusted with fine granularity over a wide range. Adjustability can alternatively be achieved by changing the number of resistors in parallel rather than the number of resistors in series. For this example, we have chosen to place four devices in series purely for illustrative purposes and contemplate that a smaller or greater number of devices may be used, depending on the granularity of control necessary to correct the unwanted sensitivities. Additionally, other configurations may be used, such as resistive ladders incorporating both parallel and series resistors switched in for greater granularity of control.

Figure 8:
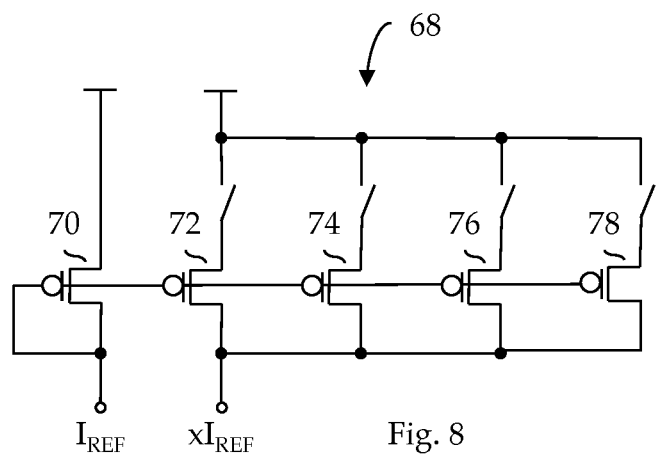
FIG. 8 illustrates, in schematic form, an exemplary tunable current mirror according to the invention shown in FIG. 5.
Figure 9:
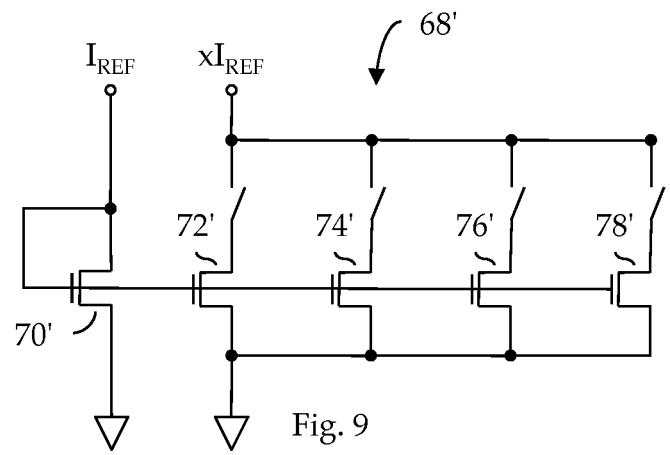
FIG. 9 illustrates, in schematic form, another exemplary tunable current mirror according to the invention shown in FIG. 5.

As noted above, our new reference current generator 32 also includes a current mirror 38 for buffering and boosting the generated current reference before distribution throughout the chip. Generally, current mirrors are commonplace in IC design and, as may be appreciated by one of ordinary skill in this art, may be used to generate any arbitrary current value for a variety of circuit blocks. Often, current mirrors are adapted to amplify a reference current prior to distribution across the IC for use by other circuit blocks to minimize the effects of noise. As is known, the generated current value is, in part, a function of the ratio of the effective width and length of the mirroring devices. These device widths and lengths are typically fixed and may lack the malleable characteristic necessary to correct unwanted sensitivities addressed previously. In accordance with an embodiment of our invention, FIG. 8 illustrates an adjustable current mirror 68 that includes the requisite mechanisms for adjusting the generated reference current. In general, adjustable current mirror 38 comprises a current reference transistor 70, and a variable number of supplemental mirror transistors adapted selectively to be connected in parallel, illustrated in FIG. 8 as devices 72, 74, 76, and 78. Variations due to process, voltage, and/or temperature may be compensated through this means of selectively connecting one or more of the transistors in parallel. Respective control bits received from configuration memory 42 select the combination of parallel output devices that are connected in parallel. In our example, transistors 72, 74, 76 and 78 are sequentially sized up by a factor of two, i.e., binary weighted, to allow the effective width of the "composite" mirror transistor to be adjusted with fine granularity over a wide range. For this example, we have chosen to place four devices in parallel purely for illustrative purposes, and contemplate that a smaller or greater number of devices may be used, depending on the granularity of control necessary to correct the unwanted sensitivities. Once again, as illustrated in FIG. 9, N-channel transistors may readily be used in lieu of P-channel transistors and will be readily apparent to one of ordinary skill in this art.

One exemplary implementation of the new reference current generator 32 uses the adjustable voltage difference generator 44 of FIG. 6 for the generation of the voltage difference, i.e., $V_{TOP}$ and $V_{BOT}$, and the adjustable resistive element 58 of FIG. 7. In this configuration, the adjustable voltage difference generator 44 may be tuned to achieve a desired temperature sensitivity while the adjustable resistive element 58 may be tuned to shift the mean absolute current to a target value. We believe that this ability to independently tune temperature sensitivity and absolute current value is extremely important for achieving post-silicon accuracy/precision.

Figure 10:
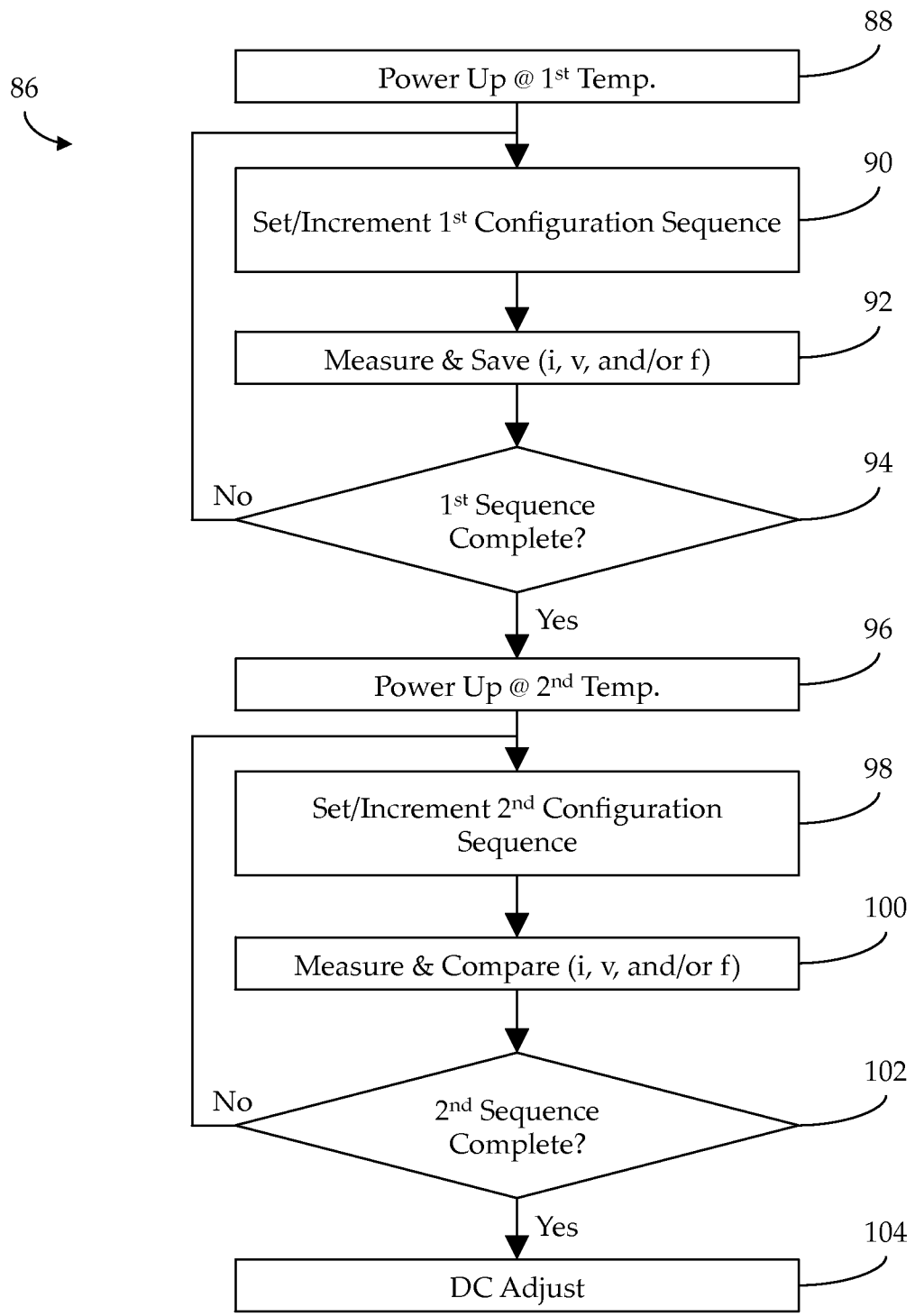
FIG. 10 illustrates, in flow diagram form, an exemplary flow for determining configuration memory settings.

FIG. 10 illustrates, in flow diagram form, the general method of managing post-silicon variations due to process, voltage, and temperature. An IC containing the new reference current generator 32 is powered up at a first temperature (see, step 88 in FIG. 10). Depending upon the application and context, this first temperature may be any acceptable temperature, in accordance with the device manufacturer's specifications. By way of example, testing of military electronics covers temperatures ranging from −55° C. to 125° C. Our preferred first temperature is approximately 25° C., although other temperatures or temperature ranges are anticipated. Subsequent to powering up the IC, configuration control bits are set (i.e., written) and sequenced in the configuration memory 42 illustrated in FIG. 5 (steps 90 and 94). By way of example, configuration control bits are written or set in the shadow registers contained within the configuration memory 42 in sequential binary order. For this example, shadow registers are used to reduce the number of times the non-volatile memory is written during testing. Other sequences other than a simple binary sequence are anticipated. The configuration memory 42 applies the bits to the adjustable circuitry described earlier and the resulting internal state information corresponding to the current bit configuration is measured, as described later in this document. The method of sequencing may be any method of stepping through a determined binary sequence of bits, i.e., simple binary sequencing, grey code sequencing, and the like. As discussed previously, these bits control the adjustment mechanisms disclosed in at least one of the adjustable voltage difference generator 44, the adjustable resistive element 58, and the adjustable current mirror 38. The internal state of at least one of the previously discussed circuits is measured (i.e., accessed) via the driver 40 and saved for subsequent analysis (step 92). As discussed previously, this internal state may be a current or a voltage. For example, referring to FIG. 3, the voltage illustrated as $V_{TOPBUF}$ may be used as an internal state voltage, buffered and supplied to the driver 40. Likewise, the reference current $I_{REF}$ may be used as an internal state current; mirrored and amplified from the diode sourcing the reference current. Such circuits for buffering and driving a voltage or mirroring and amplifying a current are readily understood by one of ordinary skill in this art. It is also anticipated that the frequency of the device may be measured and saved for future analysis as part of managing post silicon variations due to process, voltage, and/or temperature. For example, driver 40 may contain an RC oscillator fed by a mirrored version of the reference current $I_{REF}$ where the frequency of the RC oscillator may be used to infer the value of the reference current. Such RC oscillator circuits are well known in this area of the art, are typically included in an IC for use elsewhere in other functions and may be re-used as part of the driver 40, and would be readily understood by one of ordinary skill in this art.

Upon completing the first configuration sequence, the IC containing the new reference current generator 32 is powered up at a second temperature (step 96). Again, this second temperature may be any acceptable temperature that accords with the device manufacturer's specifications. Our preferred temperature is approximately 70° C., but other temperatures or temperature ranges are anticipated. As before, configuration control bits are set and sequenced in the configuration memory 42 (steps 98 and 102). And, similar, to before, the sequence may be any method of stepping through a determined binary sequence of bits. Our preferred method is to use a binary search algorithm for sequencing the bits. In this case, we begin the sequence by applying configuration control bits, where the binary value of the applied control bits or word is substantially centered within the range of available binary values for that control word. The internal state of at least one of the previously discussed circuits is measured via the driver 40 and compared to the corresponding saved state from the first configuration sequence (step 100). If the difference in values is substantially less than our predetermined criterion, we save that control word or bits as the final state of the configuration control bits. If the value is substantially greater than our predetermined criterion, a subsequent control word in the sequence is applied that is substantially centered between the current control word value and the highest binary value available for the number of bits in the control word. If, however, the value is substantially smaller than our predetermined criterion, a subsequent control word in the sequence is applied that is substantially centered between the current control word value and the lowest binary value available for the number of bits in the control word. Our preferred predetermined criterion is that, for a particular configuration control word in the sequence, the state value measured and saved from the first configuration sequence differs from the state value measured in the second sequence by less than ten percent (10%) and preferably less than approximately one percent (1%). Depending upon the context and application, other criterion may be used and are anticipated.

Figure 11:
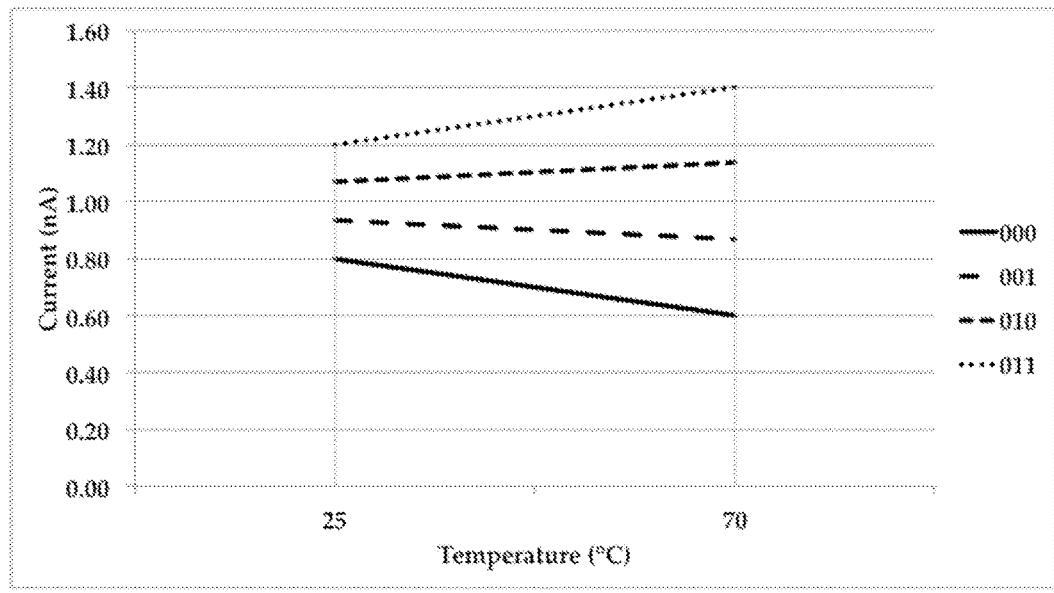
FIG. 11 illustrates, in graphical form, an exemplary set current vs. temperature curves for an exemplary set of configuration memory settings.
Figure 12:
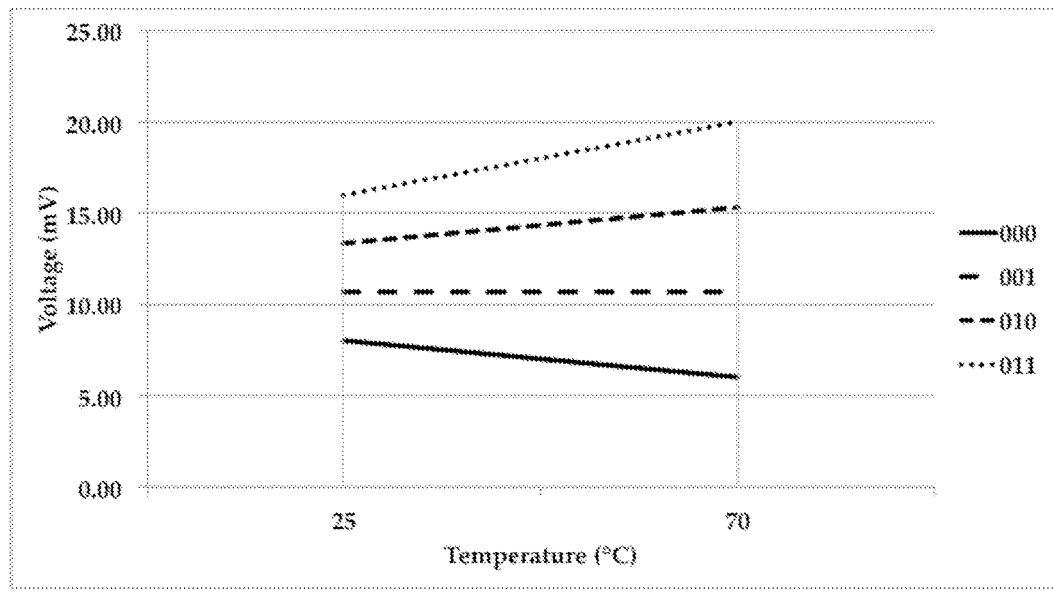
FIG. 12 illustrates, in graphical form, an exemplary set of voltage vs. temperature curves for an exemplary set of configuration memory settings.
Figure 13:
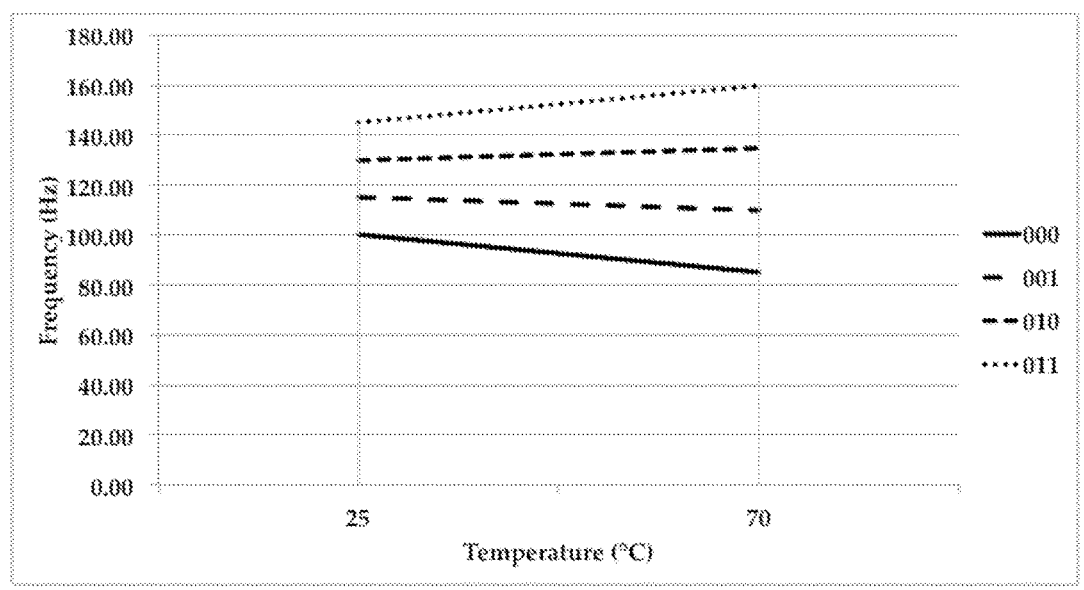
FIG. 13 illustrates, in graphical form, an exemplary set of frequency vs. temperature curves for an exemplary set of post silicon configuration memory settings.

Exemplary results of the aforementioned flow are illustrated, in graphical form, in FIG. 11, FIG. 12, and FIG. 13. FIG. 11 illustrates a set of measured currents as a function of a first chosen temperature of 25° C. and a second chosen temperature of 70° C. for a selected sequence of control bits applied, specifically the binary sequence 000, 001, 010, and 011. FIG. 12 similarly illustrates a set of measured voltages, and FIG. 13 illustrates a set of measured frequencies.

Once the selection process is completed, the selected control word is written to the non-volatile memory. Once the configuration memory 42 is written with the selected control word, the developed state currents, state voltages, or state frequencies may be smaller than anticipated, desired or required for providing the reference currents needed by the IC consuming the reference current or currents. The circuits described herein readily allow a DC adjustment to the state of the new reference current generator. One such exemplary method is to use the current mirror 38 and its associated control bits from configuration memory 42 to perform a DC shift of the current by altering the effective width of the mirror transistor(s). This and other methods of performing a DC shift of the developed current are well known to one of ordinary skill in this art and are anticipated.

Thus it is apparent that we have provided an improved method and apparatus for an ultra-low power temperature compensated reference current generator that addresses the lack of (1) a mechanism for measuring the internal state, e.g., voltages and currents, after manufacture; (2) an adjustment mechanism for managing post-silicon variations due to process, voltage, and temperature variations in the manufacturing process; and (3) a mechanism for generating multiple currents and/or voltages for use elsewhere in the IC device. In particular, we submit that our method and apparatus provide performance generally comparable to the best prior art techniques while providing more flexibility, controllability, and observability in correcting and adjusting for unwanted sensitivities associated with temperature, voltage and process variations than known implementations of prior art techniques. Therefore, we intend that our invention encompass all such variations and modifications as fall within the scope of the appended claims.

What we claim is:

1. A circuit for developing a reference current, the circuit comprising:
   a voltage difference generator adapted to:
   develop a first voltage;
   develop a second voltage; and
   selectively develop a first state voltage as a function of said first and second voltages and a first control signal;
   a resistive element adapted to:
   receive said first voltage;
   receive said second voltage;
   develop a first reference current as a function of said first voltage and said second voltage; and
   selectively develop a first state current as a function of said first and second voltages and a second control signal;
   a current mirror adapted to:
   receive said first reference current;
   develop an output reference current as a function of said first reference current; and
   selectively develop a second state current as a function of said first reference current and a third control signal; and
   a configuration memory adapted to develop a selected one of:
   said first control signal;
   said second control signal; and
   said third control signal.

2. The circuit of claim 1 wherein the circuit for developing a current reference is further characterized as comprising a driver adapted to receive a selected one of:
   said first state voltage;
   said first state current; and
   said second state current.

3. The circuit of claim 1 wherein said first voltage and said second voltage are further characterized as being closely separated.

4. The circuit of claim 1 wherein said voltage difference generator is further characterized as comprising a plurality of transistor devices operating in a sub-threshold region.

5. The circuit of claim 4 wherein said plurality of transistor devices is further characterized as a plurality of a selected one of N-channel transistors and P-Channel transistors.

6. The circuit of claim 1 wherein said resistive element is further characterized as a plurality of transistor devices operating in a sub-threshold region.

7. The circuit of claim 6 wherein said plurality of transistor devices is further characterized as comprising a selected one of N-channel transistors and P-channel transistors.

8. The circuit of claim 1 wherein said current mirror-multiplier is further characterized as a plurality of transistor devices operating in a sub-threshold region.

9. The circuit of claim 8 wherein said plurality of transistor devices is further characterized as comprising a selected one of N-channel transistors and P-channel transistors.

10. The circuit of claim 1 wherein at least a selected one of said voltage difference generator, said resistive element, and said current mirror are adapted to be tuned to effect at least a selected one of minimum temperature sensitivity, proportional-to-absolute temperature characteristic, and complementary-to-absolute temperature characteristic.

11. The circuit of claim 1 wherein:
   the voltage difference generator is further characterized as developing said first and second voltages as a function of a fourth control signal; and
   the configuration memory is further characterized as developing said fourth control signal.

12. The circuit of claim 1 wherein:
   the resistive element is further characterized as developing said first reference current as a function of said first and second voltages and a fifth control signal; and
   the configuration memory is further characterized as developing said fifth control signal.

13. The circuit of claim 1 wherein:
   the current mirror is further characterized as developing said output reference current as a function of said first reference current and a sixth control signal; and
   the configuration memory is further characterized as developing said sixth control signal.

* * * * *